United States Patent [19]

Bonafino et al.

[11] Patent Number: 5,103,293
[45] Date of Patent: Apr. 7, 1992

[54] ELECTRONIC CIRCUIT PACKAGES WITH TEAR RESISTANT ORGANIC CORES

[75] Inventors: Edward J. Bonafino, Endwell; Richard W. Carpenter, Johnson City, both of N.Y.; Peter J. Lueck, Leonberg, Fed. Rep. of Germany; William J. Summa, Endwell; David W. Wang, Vestal, both of N.Y.

[73] Assignee: International Business Machines Corporation, Armonk, N.Y.

[21] Appl. No.: 623,823

[22] Filed: Dec. 7, 1990

[51] Int. Cl.⁵ .............................. H01L 39/02
[52] U.S. Cl. ........................... 357/80; 357/74; 174/256; 361/398
[58] Field of Search .......... 357/80, 74; 174/256, 174/258; 361/398

[56] References Cited

U.S. PATENT DOCUMENTS

| | | | |
|---|---|---|---|
| 2,932,599 | 4/1960 | Dahlgren | 174/256 |
| 3,717,543 | 2/1973 | Sinclair et al. | 161/186 |
| 3,904,813 | 9/1975 | Groff | 174/68.5 |
| 4,464,704 | 8/1984 | Huie et al. | 174/256 |
| 4,626,474 | 12/1986 | Kim | 428/416 |
| 4,634,631 | 1/1987 | Gazit et al. | 428/421 |
| 4,705,720 | 11/1987 | Kundinger et al. | 428/332 |
| 4,725,484 | 2/1988 | Kumagawa et al. | 428/220 |
| 4,725,504 | 2/1988 | Knudsen et al. | 428/458 |
| 4,762,747 | 8/1988 | Liu et al. | 428/343 |
| 4,772,509 | 9/1988 | Komada et al. | 428/251 |
| 4,886,699 | 12/1989 | Carrol et al. | 174/256 |

Primary Examiner—Andrew J. James
Assistant Examiner—Sara W. Crane
Attorney, Agent, or Firm—Richard M. Goldman

[57] ABSTRACT

Disclosed are an electronic package and electronic package module. The module has a dielectric core with surface circuitization on at least one surface. The dielectric core is a composite having a thermoplastic layer interposed between two separate layers of thermoset adhesive, as epoxy dicyanate adhesive. The thermoplastic layer is preferably a polyimide. The adhesive is preferably an epoxy or dicyanate adhesive, for example a homogeneous film of thermoset resin, or a fiber reinforced thermoset resin, such as a polytetrafluorethylene reinforced epoxy or a glass fiber reinforced adhesive. The use of a thermoplastic polyimide layer interposed between adhesive layers provides a core that is particularly amenable to manufacture as a thin core.

17 Claims, 2 Drawing Sheets

ELECTRONIC CIRCUIT PACKAGES WITH TEAR RESISTANT ORGANIC CORES

FIELD OF THE INVENTION

This invention relates to microelectronic circuit packages, especially high I/O density packages. The circuit packages are characterized by individual cores or modules that combine flexibility and high tear resistance during fabrication, high tear resistance in the finished module, and efficient control of thermal expansion, with a module dielectric constant less then 3.8, a total module thickness less then 10 mils, and a dimensional stability (growth and shrinkage) during lamination that is less then 200 parts per million.

Individual modules of the package have a dielectric core with surface circuitization on at least one surface thereof. The dielectric core of the module is a dielectric composite having an organic thermoplastic dielectric layer interposed between separate layers of thermosetting dielectric materials, for example epoxy prepreg dielectric or an adhesive dielectric film. The thermoplastic layer is preferably a polyimide, while the thermosetting dielectric may be a homogeneous (nonreinforced) adhesive film or a reinforced prepreg, for example, a woven or non-woven polytetrafluorethylene or a glass fiber reinforced epoxy prepreg.

BACKGROUND OF THE INVENTION

The general structures and manufacturing processes for electronic packages are described in, for example, Donald P. Seraphim, Ronald Lasky, and Che-Yo Li, *Principles of Electronic Packaging*, McGraw-Hill Book Company, New York, N.Y., (1988), and Rao R. Tummala and Eugene J. Rymaszewski, *Microelectronic Packaging Handbook*, Van Nostrand Reinhold, New York, N.Y. (1988), both of which are hereby incorporated herein by reference.

As described by Seraphim et al., and Tummala et al., an electronic circuit contains many individual electronic circuit components, e.g., thousands or even millions of individual resistors, capacitors, inductors, diodes, and transistors. These individual circuit components are interconnected to form the circuits, and the individual circuits are interconnected to form functional units. Power and signal distribution are done through these interconnections. The individual functional units require mechanical support and structural protection. The electrical circuits require electrical energy to function, and the removal of thermal energy to remain functional. Microelectronic packages, such as, chips, modules, circuit cards, and circuit boards, are used to protect, house, cool, and interconnect circuit components and circuits.

Within a single integrated circuit, circuit component to circuit component and circuit to circuit interconnection, heat dissipation, and mechanical protection are provided by an integrated circuit chip. The chip is referred to as the "zero order package." This chip or zero order package enclosed within its module is referred to as the first level of packaging.

There is at least one further level of packaging. The second level of packaging is the circuit card. A circuit card performs at least four functions. First, the circuit card is employed because the total required circuit or bit count to perform a desired function exceeds the bit count of the first level package, i.e., the chip, and multiple chips are required. Second, the circuit card provides for signal interconnection with other circuit elements. Third, the second level package, i.e., the circuit card, provides a site for components that are not readily integrated into the first level package, i.e., the chip or module. These components include, e.g., capacitors, precision resistors, inductors, electromechanical switches, optical couplers, and the like. Fourth, the second level package provides for thermal management, i.e., heat dissipation.

In most applications, and especially personal computers, high performance workstations, mid range computers, and main frame computers, there is a third level of packaging. This is the board level package. The board contains connectors to accept a plurality of cards, circuitization to provide communication between the cards, I/O devices to provide external communication, and, frequently, sophisticated thermal management systems.

The basic process for polymer based composite package fabrication is described by George P. Schmitt, Bernd K. Appelt and Jeffrey T. Gotro, "Polymers and Polymer Based Composites for Electronic Applications" in Seraphim, Lasky, and Li, *Principles of Electronic Packaging*, pages 334–371, previously incorporated herein by reference, and by Donald P. Seraphim, Donald E. Barr, William T. Chen, George P. Schmitt, and Rao R. Tummala, "Printed Circuit Board Packaging" in Tummla and Rymaszewski, *Microelectronics Packaging Handbook*, pages 853–922, also previously incorporated herein by reference.

In the normal process for package fabrication a fibrous body, such as a non-woven mat or woven web, is impregnated with a laminating resin. This step includes coating the fibrous body with, for example, an epoxy resin solution, evaporating the solvents associated with the resin, and partially curing the resin. The partially cured resin is called a B-stage resin. The body of fibrous material and B stage resin is called a prepreg. The prepreg, which is easily handled and stable, may be cut into sheets for subsequent processing.

Typical resins used to form the prepreg include epoxy resins, cyanate ester resins, polyimides, hydrocarbon based resins, and fluoropolymers. One prepreg is the FR-4 prepreg. FR-4 is a fire retardant epoxy-glass cloth material, where the epoxy resin is the diglycidyl ether of 2,2' - bis(4-hydroxyphenyl) propane. This epoxy resin is also known as the diglycidyl ether of bisphenol-A, (DGEBA). The fire retardancy of the FR-4 prepreg is obtained by including approximately 15-20 weight percent bromine in the resin. This is done by partially substituting brominated DGEBA for the DGEBA.

Other epoxy resin formulations useful in providing prepregs include high functionality resins, such as epoxidized cresol novolacs, and epoxidized derivatives of triphenyl methane. The multifunctional epoxy resins are characterized by high glass transition temperatures, high thermal stability, and reduced moisture take up.

Still other epoxy resins are phenolic cured epoxies, as Ciba-Giegy RD86-170(TM), Ciba-Giegy RD87-211(TM), Ciba-Giegy RD87-212(TM), Dow Quatrex(®) 5010(TM), Shell Epon(®) 1151(TM), and the like. These epoxies are mixtures of epoxies, with each epoxy having a functionality of at least 2, a phenolic curing agent with a functionality of at least 2, and an imidazole catalyst.

Cyanate ester resins are also used in forming prepregs. One type of cyanate ester resin includes dicyanates mixed with methylene dianiline bis-maleimide. This product may be further blended with compatible epoxides to yield a laminate material. One such laminate material is a 50:45:5 (parts by weight) of epoxy: cyanate: maleimide. Typical of cyanate ester resins useful in forming prepregs is the product of bisphenol-A dicyanate and epoxy, which polymerizes during lamination to form a crosslinked structure.

A still further class of materials useful in forming prepregs for rigid multilayer boards are thermosetting polyimides. While thermosetting polyimides exhibit high water absorption, and high cost, they have good thermal properties and desirable mechanical properties. The preferred polyimides for prepreg use are addition products such as polyimides based on low molecular weight bis-maleimides.

By way of contrast, another type of polyimides, useful in forming stable, flexible films for flexible circuits are higher molecular weight polymers derived from dianhydrides and diamines.

One condensation polyimide based on diphenylene dianhydride is described in U.S. Pat. No. 4,725,484 to Kiyoshi Kumagawa, Kenji Kuniyasu, Toshiyuki Nishino, and Yuji Matsui for DIMENSIONALLY STABLE POLYIMIDE FILM AND PROCESS FOR PREPARATION THEREOF. This patent describes a copolymer of 3,3',4,4'- biphenyltetracarboxylic anhydride and p-phenylene diamine, commercially known as Upilex(®) S.

As noted above, the thermosetting polyimides may be reinforced with fibers to form rigid circuit boards. For example, thermosetting polyimide reinforced with polytetrafluoroethylene fibers are described in U.S. Pat. No. 4,772,509 to Ichiro Komada and Minoru Hatakeyama for PRINTED CIRCUIT BOARD BASE MATERIAL.

The polyimide may be an intermediate layer of the core, between a substrate and the circuitization, as described, for example in U.S. Pat. No. 4,705,720 of Ernst F. Kundinger, Erich Klimesch, Hans-Georg Zengel, and Jeffrey D. Lasher for FLEXIBLE MULTILAYER POLYIMIDE LAMINATES. Kundinger et al. describe a flexible circuit package having a substrate, for example, a metallic substrate, fully encapsulated in a fully reacted, fully aromatic condensation type polyimide, to which the circuitization is joined by an adhesive. Kundinger et al.'s adhesives include polyacrylates, polysulfones, epoxies, fluoropolymers, silicones, and butyl rubbers.

It is to be understood that processing of rigid boards and flexible circuits are very different manufacturing processes. In the case of manufacturing flexible circuits, subsequent processing includes circuitization, that is, the formation of a Cu signal pattern or power pattern on the film. Circuitization may be additive or subtractive. If a direct metal deposition process, such as chromium or copper sputtering is not used an adhesive is generally required between the circuitization and the flexible carrier film, especially in the case of polyimide films. Processing of flexible films is most often handled by roll to roll processes with a film width of ten inches or less.

Various adhesives have been reported for laminating copper circuitization to polyimide flexible circuit films. For example, U.S. Pat. No. 4,634,631 to Samuel Gazit and Cathy Fleischer for FLEXIBLE CIRCUIT LAMINATE AND METHOD OF MAKING THE SAME describes the use of a microglass reinforced fluoropolymer as a dielectric adhesive for flexible polyimide circuits.

Kundinger et al., U.S. Pat. No. 4,725,720, noted above, describe the use of adhesives such as polyacrylates, polysulfones, epoxies, fluoropolymers, silicones, and butyl rubbers to obtain adhesion between a polyimide layer and the circuitization.

U.S. Pat. No. 4,725,504 to Phillip D. Knudsen and Daniel P. Walsh for METAL COATED LAMINATE PRODUCTS MADE FROM TEXTURED POLYIMIDE FILM describes the use of electroless Ni or Co to bond the Cu circuitization to a polyimide layer of a printed circuit board.

U.S. Pat. No. 3,717,543 to James R. Sinclair, and Gordon M. Ellis, Jr. for LAMINATIONS OF POLYIMIDE FILMS TO LIKE METALS AND/OR METAL FOILS describes an adhesive for bonding polyimide to either a metal, as a circuitization layer, or to another polyimide film. The adhesive is an acrylic-epoxy copolymer, as an ammoniated acrylic and a low molecular weight epichlorohydrin bisphenol A copolymer.

U.S. Pat. No. 3,904,813 to Gaylord L. Groff for ADHESIVE FOR METAL CLAD SHEETING describes an adhesive that is the reaction product of a carboxyl terminated polymer (as azelaic acid and neopentyl glycol) and a high molecular weight polymeric reaction product of bisphenol A and epichlorohydrin.

U.S. Pat. No. 4,762,747 to Jong-Min Liu, Fu-Lung Chen, and Yeong-Cheng Chiou for SINGLE COMPONENT AQUEOUS ACRYLIC ADHESIVE COMPOSITIONS FOR FLEXIBLE PRINTED CIRCUITS AND LAMINATES MADE THEREFROM describes a printed circuit board having an adhesive layer on polyimide. The adhesive contains (1) an acrylonitrile, (2) an alkyl acrylate or methacrylate, (3) an oxirane containing polymerizing ethylenic monomer, (4) a hydroxyl or amide containing acrylate or methacrylate, and (5) styrene.

U.S. Pat. No. 4,627,474 to Ki-Soo Kim for POLYIMIDE FILM/METAL FOIL LAMINATION describes the use of an unreinforced epoxy adhesive to laminate metal foils to a polyimide film.

By way of contrast with the above described process for flexible circuits, the rigid multilayer composite printed circuit package is fabricated by interleaving cores (including signal cores, signal/signal cores, power cores, power/power cores, and signal/power cores) with additional sheets of prepreg, and surface circuitization. After lamination, hole drilling, photolithography, and plating processes are repeated, a rigid multilayer composite is obtained. The size of the rigid multilayer composite can reach 670 square inches (24 inches by 28 inches) or more, with thicknesses of 250 mils or more.

The initial fabrication of the cores is carried out with large area laminates, i.e., up to thirty six inches or more, which are subsequently cut into smaller area assemblies. It is particularly important that these laminates neither delaminate nor tear during fabrication. Moreover, the complex sequence of these steps combined with the chemically and physically aggressive nature of many of these steps results in product compromise and loss. Moreover, increasing clock rates require low impedance, low dielectric constant, thin cores. Thus, there is a clear need for a thin, rugged, thermally stable microelectronic package core, with matched coefficients of thermal expansion between the layers, that is fabricated of materials that are adapted for ease of manufacturing, including high peel strength, tear resistance and toughness while allowing the production of large surface area thin cores, i.e., less then 8 mils thick, by the use of conventional rigid core fabrication processes.

OBJECTS OF THE INVENTION

The primary objects of the invention are to provide a thin composite core structure with high electrical performance, and to provide this composite core structure in a microelectronic package adapted for ease of manufacturing in a conventional multilayer rigid board manufacturing environment, with tear resistance and toughness during lamination.

It is a further object of the invention to provide a printed circuit thin core laminate of a thin, flexible thermoplastic film between adhesive layers, which may be homogeneous or reinforced, for example with woven or non-woven materials.

It is a further object of the invention to provide a microelectronic package having toughness and tear resistance during fabrication while maintaining signal core organic thickness, from circuitization layer through the organic layers, to the opposite circuitization layer, that is less then 10 mils, and preferably less then 8 mils.

It is a further object of the invention to produce this thin core laminate on conventional thick core manufacturing apparatus.

It is a further object of the invention to provide a microelectronic package having a high interlaminar peel strength during fabrication.

t is a further object of the invention to provide a microelectronic package having an organic portion with a coefficient of thermal expansion of 8 to 25 parts per million per degree C that provides minimum mismatch of the individual layer coefficients of thermal expansion.

It is a still further object of the invention to provide a microelectronic package having a structure that avoids severe mismatches of component and layer coefficients of thermal expansion.

SUMMARY OF THE INVENTION

The deficiencies of the prior art are obviated and the objects of the invention are attained by the electronic package and package module described herein.

The electronic package module of the invention has a thin dielectric core with surface circuitization on at least one surface. The dielectric core is a laminate, that is, a composite, having a thermoplastic layer interposed between two separate layers of adhesive, characterized by good adhesion between the thermoplastic layer and the adhesive layers. The thermoplastic layer is preferably a polyimide, such as Upilex(®) SGA(TM) The adhesive is preferably a thermosetting adhesive, such as an epoxy adhesive or a cyanate ester adhesive, and is either a homogeneous epoxy or cyanate ester adhesive (such as, an unreinforced epoxy or cyanate ester adhesive layer) or a fiber reinforced adhesive (such as, a woven or non-woven glass fiber or polytetrafluoroethylene reinforced epoxy or cyanate ester adhesive).

THE FIGURES

Specific details of the microelectronic package of the invention and of the modules thereof are illustrated in the figures.

DETAILED DESCRIPTION OF THE INVENTION

The microelectronic packages and package modules of the invention are characterized by very narrow spacing between circuitization layers, for example between adjacent signal plane layers, for example less then about 10 mils between signal plane layers, and between signal plane layers and adjacent power and ground core layers. These packages are intended for high frequency applications. The narrow spacing between planes, translated into thin organic layers, results in fabrication problems, especially tearing and delamination, while the combination of the narrow spacing between signal planes and the anticipated high frequencies make dissipative effects a major design element of the package. The narrow interplanar spacing results in signal dissipation and distortion through the effect of the complex impedance, Z. Impedance converts the lost electrical energy into thermal energy, H, and the full range of thermal management issues, including losses in reliability and structural integrity (through mismatched coefficients of thermal expansion) become highly relevant.

Figure 1:
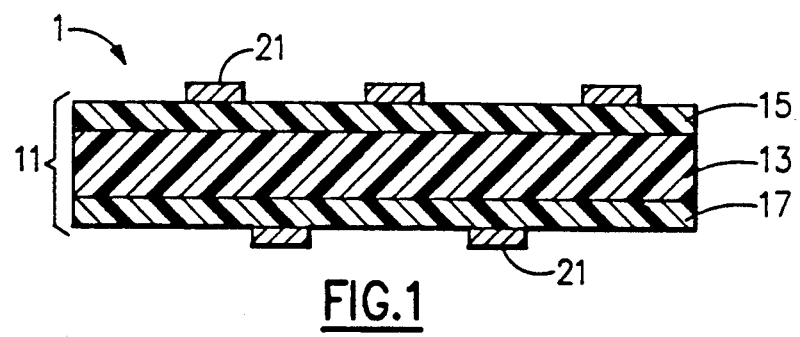
FIG. 1 shows a cutaway plan view of simple signal core structure incorporating the basic laminated composite of the invention.
Figure 2:
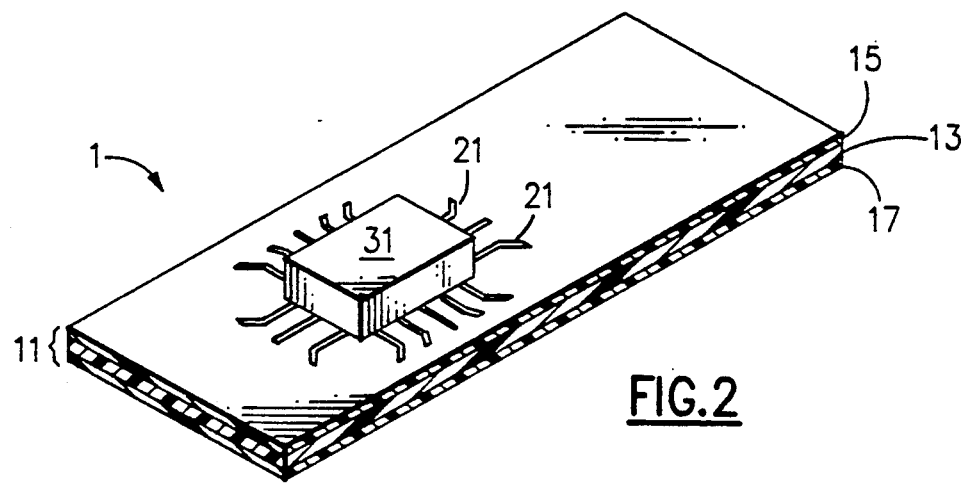
FIG. 2 is a partial cutaway perspective view of a simplified microelectronic package incorporating the signal core of FIG. 1.

One exemplification of the electronic package module of the invention is shown in FIG. 1 and a printed circuit board incorporating the electronic package module is shown in FIG. 2. The electronic package module (1) has a dielectric core (11) with surface circuitization (21) and an integrated circuit chip (31) on at least one surface thereof. The dielectric core (11) is a composite with a rugged thermoplastic layer (13), as a polyimide, interposed between two separate layers (15,17) of an adhesive, as a polymeric resin, for example thermosetting epoxy resins, cyanate esters, polyimides, etc.

In a preferred exemplification the thermoplastic layer (13) is polyimide, and the adhesive layers (15,17) are cyanate ester and epoxy polymers. This results in laminates of uniformly low coefficients of thermal expansion, i.e., the coefficient of thermal expansion approaches that of the copper circuitization, high dimensional stability, and ease of manufacturing, i.e., the absence of tearing, peeling, or delamination, especially when formed in large sheets, with at least one dimension in excess of eighteen inches.

The preferred thermoplastics are polyimides, with a particularly preferred polyimide being Upilex(®) SGA(TM). Polyimides, and especially Upilex(®) SGA(TM), have good moisture resistance, thermal properties, and desirable mechanical properties. These properties make them particularly advantageous for printed circuit board modules. The preferred polyimides for film use are condensation products, such as polyimides based on biphenylene dianhydrides. Especially preferred are copolymers derived from biphenylene dianhydrides and phenylene diamines. Especially preferred is the polyimide derived from 3,3',4,4'-biphenyltetracarboxylic anhydride and p-phenylene diamine. This copolymer has the structure depicted below:

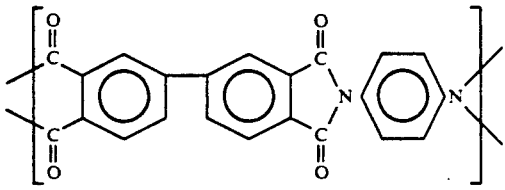

Upilex(®) S(TM), which is a particularly preferred composition based upon this material, has a dielectric coefficient of 3.2 to 3.5, and a thermal decomposition temperature above about 600 degrees Centigrade. Typical epoxy adhesion to this material is about one pound per inch, making it particularly desirable for pre-preg boards.

When this particularly preferred polyimide is suitably modified by the incorporation of, for example, a silane coupling agent into the polymeric matrix, as is the case with Upilex(®) SGA(TM), the adhesion is above about 9 pound/inch. The silane coupling agent modified polyimide is especially preferred for the thermoplastic core material. The properties of the modified material makes it use especially advantageous in combination with the polyepoxide adhesives at polyimide thicknesses as low as 0.8 mils.

While the adhesive layer is referred to as an an epoxy layer, other adhesives may be utilized, although epoxy adhesives are preferred. The epoxy layers (15,17) are either homogeneous (unreinforced) epoxy adhesive layers or fiber reinforced epoxy adhesive layers. The preferred epoxy is the polymeric reaction product of BrDGEBA and phenolics. These particularly preferred epoxies are mixtures of two or more epoxies, each of the epoxies in the mixture having a functionality of at least two, a phenolic curing agent, also with a functionality of not less then two, and an imidazole catalyst. These epoxies are sold by Ciba-Giegy under the designations RD86-170(TM), RD87-211(TM), and RD87-212(TM), by Shell Chemical Co. under the designation EPON(®) 1151(TM), and by Dow Chemical Corp. under the designation Quatrex(®) 5010(TM).

When the adhesive layers (15,17) are reinforced, the typical reinforcement materials include woven and nonwoven fibers, and films made of glass fibers include glass fibers, such as woven fused quartz, E-glass fabric, S-glass, D-glass, and high silica glass, and organic fibers such as aramids (exemplified by Kevlar(®) and Nomex(®)), polyether ether ketone, aromatic polyesters, polybenzobisthiazole (PBZT), polybenzobisoxazole (PBO), fluorocarbons, as polytetrafluoroethylene, and graphite fibers.

Figure 3:
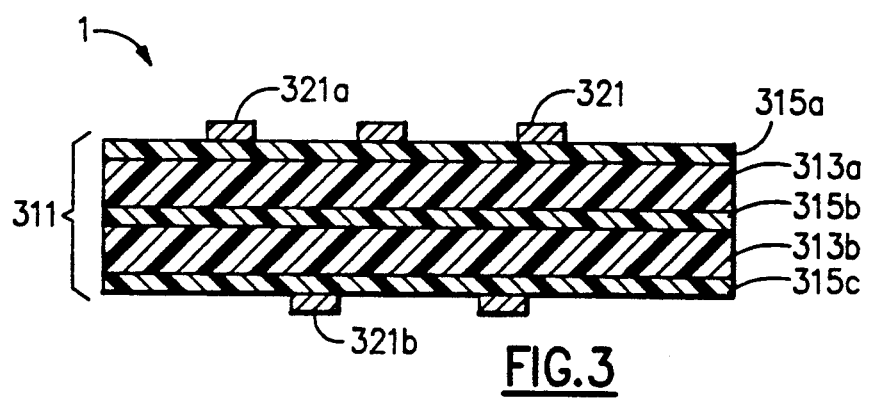
FIG. 3 shows an alternative structure with two thermoplastic layers and three adhesive layers.

Returning to the FIGURES, as clearly shown in FIG. 1 the composite (11) comprises a polyimide layer (13) interposed between two separate layers (15,17) of an epoxy adhesive, such as an unreinforced epoxy adhesive or a glass fiber reinforced epoxy adhesive, or a woven or nonwoven polytetrafluroethylene reinforced epoxy adhesive. In a particularly preferred exemplification shown in FIG. 1 the thickness of the polyimide thermoplastic layer (13) is from about 0.8 to about 2.0 mils, and the thicknesses of the epoxy adhesive layers (15,17) are from about 0.1 to about 0.8 mils in the case of homogeneous layers, and about 1 to 4 mils in the case of prepreg layers. This range of thicknesses gives particularly desirable manufacturing properties, characterized by significantly reduced tearing, peeling, and delamination during fabrication. An alternative structure is shown in FIG. 3. In the structure shown in FIG. 3 three adhesive layers (315a, 315b, 315c) and two thermoplastic layers (313a, 313b) separate the circuitization layers (321a, 321b). In this structure the composite (311) comprises two polyimide layers (313a, 313b), each interposed between a pair of adhesive layers (315a and 315b, 315b and 315c) of epoxy, including polytetrafluroethylene reinforced epoxy and glass reinforced epoxy. In the exemplification shown in FIG. 3 the thickness of each of the polyimide thermoplastic layers (313a, 313b) is from about 0.8 to about 2.0 mils, and the thicknesses of the three epoxy layers (315a, 315b, 315c) are from about 0.1 to about 0.8 mils in the case of homogeneous layers, and about 1 to 4 mils in the case of prepreg.

Figure 4:
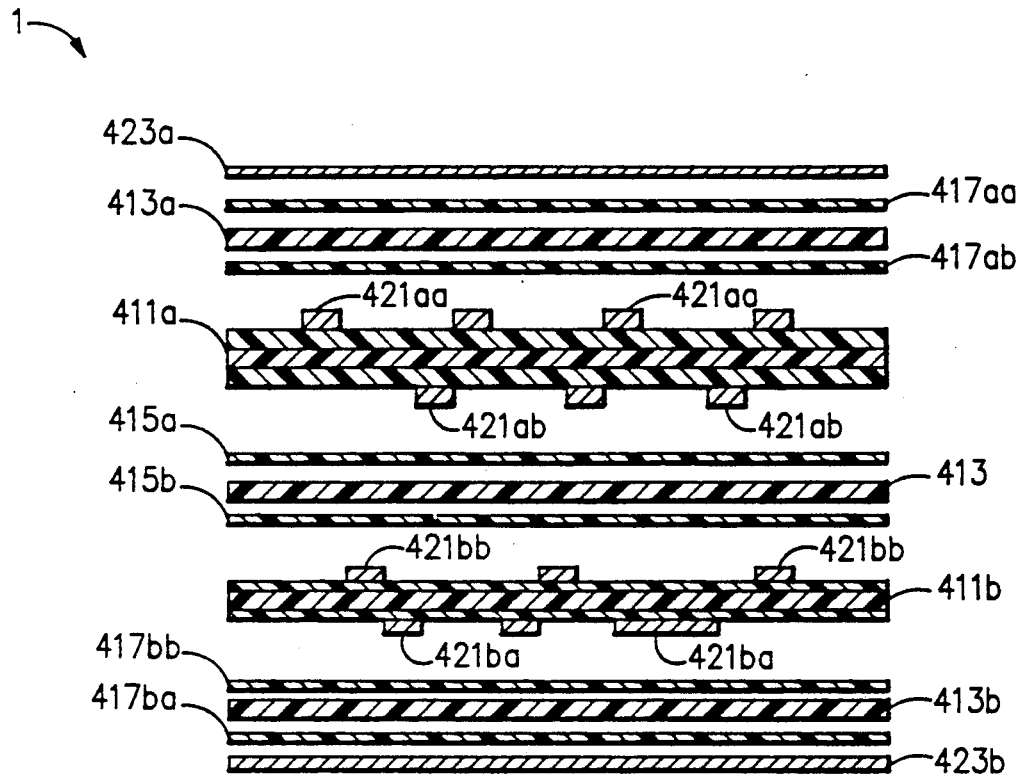
FIG. 4 shows an exploded view of a multilayer microelectronic package utilizing multiple iterations of the invention.

FIG. 4 shows a multilayer structure incorporating the thin core (411a, 411b) of the invention. Specifically, the structure shown in FIG. 4 includes two signal cores (411a, 411b). Each signal core (411a, 411b) has two circuitization layers (421aa and 421ab; 421ba and 421bb) and may have either the single thermoplastic layer type of structure shown in FIG. 1 or the multiple thermoplastic layer type of structure shown in FIG. 3. The two signal cores (411a, 411b) are separated from each other by two adhesive layers (415a, 415b) and one thermoplastic layer (417), while each of the power layers (423a, 423b) is separated from the adjacent signal core (411a, 411b) by two adhesive layers (417aa, 417ab; 417ba, 417bb) with a thermoplastic layer (413a, 413b) therebetween. In the exemplification shown in FIG. 4 the thickness of each of the polyimide thermoplastic layers (413a, 413b) is from about 0.8 to about 2.0 mils, and the thicknesses of the epoxy adhesive layers (415, 417) are from about 0.1 to about 0.8 mils in the case of homogeneous layers and from about 1.0 to about 4.0 mils in the case of prepreg.

Figure 5:
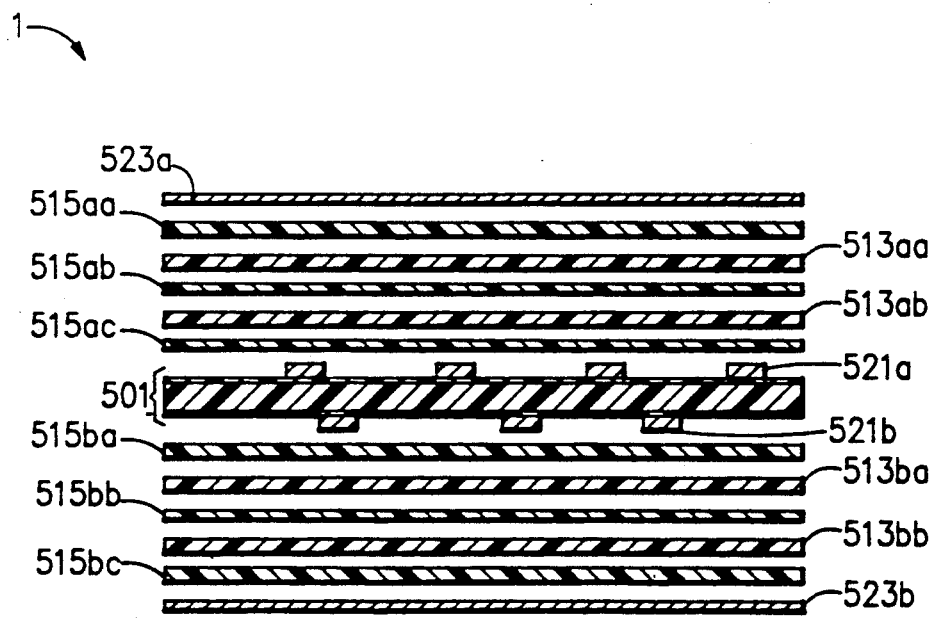
FIG. 5 shows an exploded view of an alternative multilayer microelectronic package utilizing multiple iterations of this invention to increase the dielectric thickness.

FIG. 5 shows a still further embodiment of a 2S/2P (2 signal plane, 2 power plane) structure incorporating the thin core (501) of the invention. Specifically, the structure shown in FIG. 5 includes one signal core (501). This signal core (501) has two circuitization layers (521a, 521b) and and may have either the single thermoplastic layer type of structure shown in FIG. 1 or the multiple thermoplastic layer type of structure shown in FIG. 3. Each of the power layers (523a, 523b) is separated from the signal core (501) by three adhesive layers (515aa, 515ab, 515ac; 515ba, 515bb, 515bc), such as homogeneous adhesive layers or prepreg (reinforced) layers, with a thermoplastic layer (513aa, 513ab; 513ba, 513bb) between each pair of adhesive layers. In the exemplification shown in FIG. 5 the thickness of each of the polyimide thermoplastic layers (513aa, 513ab, 513ba, 513bb) is from about 0.8 to about 2.0 mils, and the thicknesses of the epoxy adhesive layers (515aa, 515ab, 515ac; 515ba, 515bb, 515bc) are from about 0.1 to about 0.8 mils in the case of homogeneous layers and from about 1.0 to about 4.0 mils in the case of prepreg.

While specific geometries of adhesive layers and thermoplastic layers have been illustrated and described, it is to be understood that such illustrations and descriptions are meant to be exemplary and not limiting, and that other geometries and arrangements are included within the scope of the invention.

While the invention has been described with respect to certain preferred embodiments and exemplifications thereof, it is not to be limited thereby, but is defined solely by the claims appended hereto.

We claim:

1. An electronic package module adapted to carry surface electric circuitization on a polymeric composite dielectric core comprising a thermoplastic layer interposed between two separate layers of thermoset resin.

2. The electronic package module of claim 1 wherein the thermoplastic layer comprises polyimide.

3. The electronic package module of claim 2 wherein both of the thermoset resin layers are reinforced thermoset resin layers.

4. The electronic package module of claim 3 wherein the thickness of the thermoplastic polyimide layer is from about 0.8 to about 2.0 mils, and the thicknesses of each of the reinforced thermoset resin layers is from about 1 to about 4 mils.

5. The electronic package module of claim 3 wherein the reinforcement is chosen from the group consisting of woven and nonwoven fiber glass, polytetrafluoroethylene fibers, and organic fibers.

6. The electronic package module of claim 2 wherein both of the thermoset resin layers are homogeneous layers.

7. The electronic package module of claim 6 wherein the thickness of the thermoplastic polyimide layer is from about 0.8 to 2.0 mils, and the thicknesses of each of the homogeneous thermoset resin layers are from about 0.1 to 0.8 mils.

8. The electronic package module of claim 2 wherein the thermoset resin is chosen form the group consisting of epoxy resins and cyanate ester resins.

9. A rigid, multilayer electronic circuit package comprising a plurality of circuitized laminated electronic package modules, and having electric signal planes and electric power planes, at least one of said modules being a polymeric dielectric composite core comprising a thermoplastic layer interposed between two separate layers of thermoset resin.

10. The electronic package of claim 9 wherein the thermoplastic layer comprises polyimide.

11. The electronic package of claim 10 wherein each of the thermoset resin layers are reinforced thermoset resin layers.

12. The electronic package of claim 11 wherein the thickness of the thermoplastic polyimide layer is from about 0.8 to about 2.0 mils, and the thicknesses of each of the fiber reinforced thermoset resin layers are from about 1 to about 4 mils.

13. The electronic package of claim 11 wherein the reinforcement is chosen from the group consisting of woven and nonwoven fiber glass, polytetrafluoroethylene fibers, and organic fibers.

14. The electronic package of claim 10 wherein the thermoset resin layer is a homogeneous layer.

15. The electronic package of claim 14 wherein the thickness of the thermoplastic polyimide layer is from about 0.8 to 2.0 mils, and the thicknesses of the homogeneous thermoset resin layers are from about 0.1 to 0.8 mils.

16. The electronic package of claim 10 wherein the thermoset resin is chosen from the group consisting of epoxy resins and cyanate ester resins.

17. An electronic package module adapted to carry surface electric circuitization on a polymeric composite dielectric core comprising a polyimide layer interposed between two separate layers of thermoset resin adhesive.

* * * * *